US009201997B2

(12) United States Patent
Storace et al.

(10) Patent No.: US 9,201,997 B2
(45) Date of Patent: Dec. 1, 2015

(54) METHOD FOR CREATING DIGITAL CIRCUITS OF A FEEDBACK CONTROL SYSTEM THAT IMPLEMENTS AN APPROXIMATION TECHNIQUE FOR MODEL PREDICTIVE CONTROL (MPC)

(71) Applicant: UNIVERSITA' DEGLI STUDI DI GENOVA, Genoa (IT)

(72) Inventors: Marco Storace, Genoa (IT); Tomaso Poggi, Genoa (IT); Alberto Oliveri, Genoa (IT); Alberto Bemporad, Lucca (IT)

(73) Assignee: UNIVERSITA' DEGLI STUDI DI GENOVA, Genoa (IT)

( * ) Notice: Subject to any disclaimer, the term of this patent is extended or adjusted under 35 U.S.C. 154(b) by 0 days.

(21) Appl. No.: 14/405,229

(22) PCT Filed: May 21, 2013

(86) PCT No.: PCT/IB2013/054179
§ 371 (c)(1),
(2) Date: Dec. 3, 2014

(87) PCT Pub. No.: WO2013/182934
PCT Pub. Date: Dec. 12, 2013

(65) Prior Publication Data
US 2015/0145558 A1 May 28, 2015

(30) Foreign Application Priority Data
Jun. 4, 2012 (EP) .................................... 12425106

(51) Int. Cl.
*G06F 17/50* (2006.01)
*G05B 13/04* (2006.01)
*H03K 19/0175* (2006.01)

(52) U.S. Cl.
CPC ............ *G06F 17/505* (2013.01); *G05B 13/048* (2013.01); *H03K 19/017581* (2013.01)

(58) Field of Classification Search
CPC ........................ G06F 17/505; H03K 19/0175
USPC ..................................... 716/101, 104; 326/38
See application file for complete search history.

(56) References Cited

U.S. PATENT DOCUMENTS

2014/0358254 A1* 12/2014 Chu et al. ..................... 700/29
2015/0094939 A1* 4/2015 D'Amato et al. ............. 701/115

FOREIGN PATENT DOCUMENTS

EP           1426840 A1    6/2004

OTHER PUBLICATIONS

International Search Report on International Application No. PCT/IB2013/054179, mailed on Nov. 6, 2013.
Bemporad et al., "Ultra-Fast Stabilizing Model Predictive Control via Canonical Piecewise Affine Approximations" published on IEEE Transactions on Automatic Control, pp. 2283-2897, Dec. 2011.

* cited by examiner

*Primary Examiner* — Don Le
(74) *Attorney, Agent, or Firm* — Buchanan Nipper

(57) ABSTRACT

Method for creating digital circuits of an MPC controller (2), which implements an approximation technique for Model Predictive Control (MPC), in which a quadratic programming (QP) or linear programming (LP) optimization problem is formulated by starting from a model defined over a set of states of a state (x), wherein the said set of states is partitioned into simplices identified by vertices (v), and wherein said method comprises the steps of a) compute a solution (w*) of the optimization problem and define a control law (u(x)); b) check the stability under the control law (u(x)); c) synthesize a digital circuit by starting from the control law (u(x)) and the vertices ($v_i$).

15 Claims, 10 Drawing Sheets

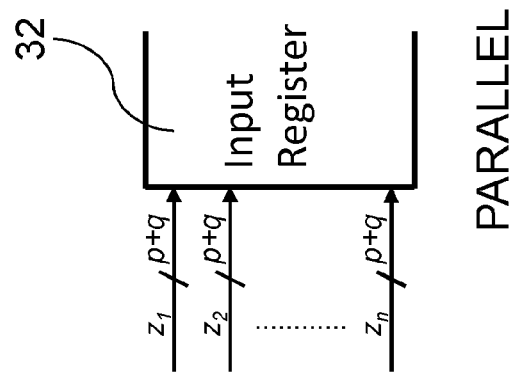
Fig. 8c PARALLEL
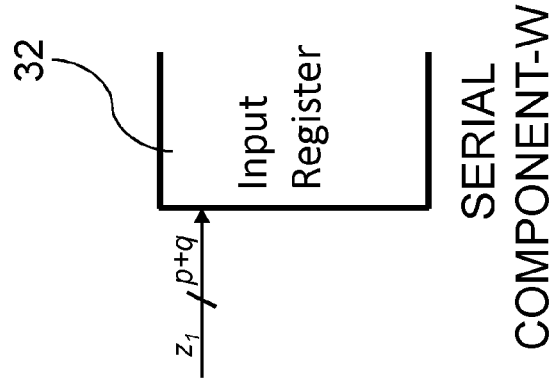
Fig. 8b SERIAL COMPONENT-WISE
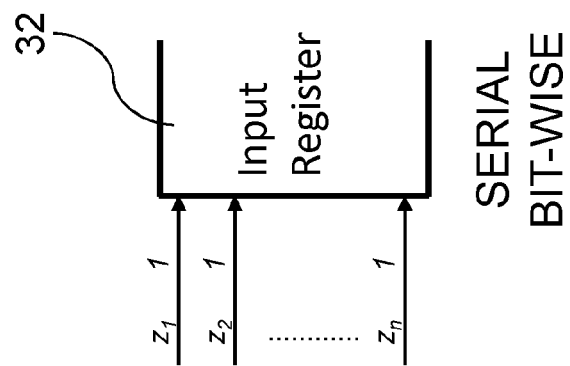
Fig. 8a SERIAL BIT-WISE

METHOD FOR CREATING DIGITAL CIRCUITS OF A FEEDBACK CONTROL SYSTEM THAT IMPLEMENTS AN APPROXIMATION TECHNIQUE FOR MODEL PREDICTIVE CONTROL (MPC)

In its most general aspect, the present invention relates to a method for creating digital circuits of a feedback control system that implements an approximation technique for Model Predictive Control (MPC). In addition to that, circuit architectures of the aforesaid control system are also described.

MPC is an increasingly popular technique in industry for feedback control of a multivariable process subject to constraints on manipulated and controlled variables. A generic physical process like the one shown in FIG. 1, which can be modeled by either a continuous-time or a discrete-time linear system of equations (i.e. by a linear state-space dynamical model, see Formula 1), can be regulated to the origin ($r_k$=0; the general case of tracking nonzero reference signals will be treated later) by a feedback controller implementing a MPC technique.

Continuous-time model: $\begin{cases} \dot{x} = \tilde{A}x(t) + \tilde{B}u(t) \\ y(t) = Cx(t) \end{cases}$ Formula 1

Discrete-time model (with sampling time $t_s$): $\begin{cases} x_{k+1} = Ax_k + Bu_k \\ y_k = Cx_k \end{cases}$ $x_k = x(t+kt_s)$, $y_k = y(t+kt_s)$, $u_k = u(t+kt_s)$ $x \in \mathcal{R}^{n_x}$, $y \in \mathcal{R}^{n_y}$, $u \in \mathcal{R}^{n_u}$, $A, \tilde{A} \in \mathcal{R}^{n_x \times n_x}$, $B, \tilde{B} \in \mathcal{R}^{n_x \times n_u}$, $C \in \mathcal{R}^{n_y \times n_x}$ Indeed, MPC gives an effective solution to the problem of regulating the system to the origin while fulfilling constraints on input, output and state variables. Here, at each sampling time, starting at the current state, an open-loop optimal control problem is solved over a finite horizon. At the next time step, the computation is repeated starting from the new state and over a shifted horizon, leading to a moving horizon policy. The solution relies on a linear dynamic model, respects all input and output constraints, and optimizes a quadratic performance index. Over the last decades, a solid theoretical foundation for MPC has emerged so that in real life, large-scale Multi-Input and Multi-Output (MIMO) applications controllers with non-conservative stability guarantees can be designed routinely and easily. The main drawback of the MPC is the relatively high on-line computational effort, which limits its applicability to relatively slow and/or small problems.

Nevertheless, it is possible to move all the computations necessary for the implementation of MPC off-line, while preserving all its other characteristics. In fact, the optimal control law can be expressed as a PWA (vector) function of the state variables, obtained solving a multi-parametric quadratic programming (mpQP) problem. Consider a MPC algorithm based on the linear discrete-time prediction model given in Formula 1 of the open-loop process and on the solution of the finite-time optimal control problem $$\min_U \; x_N' P x_N + \left( \sum_{k=0}^{N-1} x_k' Q x_k + u_k' R u_k \right) + \rho \varepsilon^2 \quad \text{Formula 2}$$

s.t: $x_{k+1} = Ax_k + Bu_k$, $k = 0, \ldots, N-1$, $x_0 = x(t)$ $u_k = Kx_k$, $k = N_u, \ldots, N-1$ $E_u u_k \leq G_u$, $k = 0, \ldots, N_u - 1$, $E_u u_k \leq G_u + V_u \varepsilon$, $k = N_u, \ldots, N-1$ $E_x u_k + F_x x_k \leq G_x + V_x \varepsilon$, $k = 0, \ldots, N-1$ $\varepsilon > 0$ where N is the prediction horizon, $N_u$ (<N) is the control horizon, $U^* = [u^*_0, \ldots, u^*_{N_u-1}, \epsilon]'$ is the vector of variables to be optimized, $Q=Q'\geq 0$ (i.e., Q is symmetric and semidefinite positive), $R=R'>0$ and $P=P'\geq 0$ are weight matrices of appropriate dimensions defining the performance index, $\epsilon$ is a slack variable relaxing the constraints, and p>0 is a (large) weight penalizing constraint violations. $E_u$, $G_u$, $V_u$ and $E_x$, $F_x$, $G_x$, $V_x$ are matrices of appropriate dimensions defining constraints on input variables, and on output and state variables, respectively. Vector $V_x>0$ defines the degree of softening of the mixed input/state constraints. Similarly, input constraints can be softened by imposing $V_u>0$. K is a terminal gain defining the remaining control moves after the expiration of the control horizon $N_u$; for instance K=0, or K is the linear quadratic regulator gain associated with matrices Q and R, and P is the corresponding Riccati matrix. By substituting $x_k = A^k x_0 + \sum_{j=0}^{k-1} A^j B u_{k-1-j}$ the MPC problem in Formula 2 can be cast as the following multiparametric quadratic programming problem (mpQP)

$$U^*_{PWA}(x) = \operatorname*{argmin}_U \left\{ U'HU + x'F'U + \frac{1}{2}x'Yx \right\} \quad \text{Formula 3}$$

s.t. $GU \leq W + Dx$ where $U^*_{PWA} = [u^*_0, \ldots, u^*_{N_u-1}, \epsilon]'$ is a vector collecting the optimal control value for the current time step ($u^*_0(x)$) and at the following predicted time steps ($u^*_1(x), \ldots, u^*_{N_u-1}(x)$), and $x=x(t+kt_s)=x_k$ is the current state vector. At each time step, only $u^*_0(x)$ is applied whereas the remaining functions are discarded. It can be shown that the vector $u^*_0(x)$ is a piecewise-affine (PWA) function of x defined over a subset of the state space (see Formula 4).

$$u_0^*(x) = \begin{cases} F_1 x + g_1 & \text{if } H_1 x \leq k_1 \\ F_p x + g_p & \text{if } H_p x \leq k_p \end{cases} \quad \text{Formula 4}$$

The values of the gain F and the offset $g_i$ depend on the region, defined by the polyhedron $\{x: H_i x \leq k_i\}$ containing the state x. Therefore, the evaluation of the vector $u^*_0(x)$ requires finding the region that contains the current state x, a problem known as "point location problem." This problem can be solved by digital circuits employing organized data structures (e.g. binary search trees). The main drawback is that the number p of regions that define the state partition grows largely with the number of constraints in Formula 2 and the extension $N_u$ of the control horizon. Moreover, the size of the memory inside the circuit increases with the number of coefficients required to define properly each region and the affine expressions.

Determining a proper control function u(x) that is feasible, stabilizing, and easy to implement at the same time is a key aspect for MPC implementation. To face this problem, Bemporad et al. in the paper titled "Ultra-Fast Stabilizing Model Predictive Control via Canonical Piecewise Affine Approximations" published on IEEE Transactions on Automatic Control, pp. 2883-2897, Dec. 2011 (doi: 10.1109/TAC.2011.2141410) describe an alternative control law based on a suboptimal solution to the MPC problem. Instead of using the PWA function $u^*_0(x)$ obtained by solving the mpQP problem, they use piecewise-affine simplicial (PWAS) functions to approximate the optimal control law. To this end, they formulate an optimization problem (either quadratic or linear) imposing a set of conditions that guarantee the feasibility of the solution with respect to the MPC constraints. The suboptimal solution can be implemented on circuits that are faster in terms of throughput and have a simpler structure with respect to the circuits implementing the PWA optimal solution to the MPC problem.

PWAS functions are a particular class of PWA functions defined over a regularly shaped partition of the set of possible states x. This partition is composed by simplices (a simplex is a segment in a one-dimensional space, a triangle in a two-dimensional space, a tetrahedron in a tree-dimensional space, and so on). The set of states is partitioned into simplices as follows. Every dimensional component $x_j = [x_{j,MIN}, x_{j,MAX}]$, $j=1, \ldots, n$ (meaning that the set of states is hyperrectangular) of the state is divided into $p_j$ subintervals of uniform length. Consequently, the set of states is divided into hyper-rectangles, and contains $N_v = \pi_{j=1}^n (p_j+1)$ vertices $v_i$. Each hyperrectangle is further partitioned into n! simplices with non-overlapping interiors.

The regularity of the partition allows expressing the value of a continuous PWAS function as a linear combination of basis functions (see Formula 5).

$$u(x) = \sum_{i=1}^{N_v} w_i \varphi_i(x) \quad \text{Formula 5}$$

Once the partition and the set of basis functions $\phi_i(x)$ have been fixed, the PWAS function u(x) is completely defined by the set of coefficients $w_i$.

PWAS functions can be easily implemented on digital circuits. Indeed, it is possible to calculate the value of a PWAS function at a point x by interpolating the values of the PWAS function at the vertices of the simplex containing x.

The method proposed by Bemporad et al. aims at obtaining a PWAS function u(x) which minimizes the distance (in a properly defined metric space) from the optimal solution $u^*_0(x)$ of the MPC problem, while fulfilling the MPC constraints. This function is defined by a set of coefficients $w_i$. A cost function used to compute the coefficients $w_i$ of the PWAS function u(x) is shown in Formula 6.

$$\int_{dom(x)} |u_0^*(x) - u(x)|^2 \, dx + \sum_{i=1}^{N\sigma} \sigma_i^2 \quad \text{Formula 6}$$

This cost function utilizes the norm $L^2$, in order to compute the distance between the optimal solution $u^*_0(x)$ and the approximated one u(x). The latter is obtained through the minimization of the cost function, with respect to the coefficients $w_i$ and to the $N_\sigma$ slack variables $\sigma_i$.

Some constraints derived from those appearing in the problem shown in Formula 3 are inserted in the minimization of the cost function shown in Formula 6, in order to fulfill the MPC constraints on input u, output y and state x.

$$\tilde{G}u(x) \leq W + Dx + Z[u^*_1(x), \ldots, u^*_{N_u-1}(x)]^T + S\sigma(x) \quad \text{Formula 7}$$

where $\tilde{G}$, W, D, Z and S are matrices of appropriate dimensions and $\sigma(x) = \sum_{i=1}^{n_v} \sigma_i \phi(x)$ is a PWAS function used to relax output and state constraints. Notice that values of variables $\sigma_i > 0$ are minimized by Formula 6 to be selected as low as possible.

This approximation method does not guarantee a priori the stability of the closed-loop system shown in FIG. 1. Thus, an a posteriori stability analysis is required. This analysis can be carried out by constructing a PWA Lyapunov function whose existence demonstrates the stability of the closed-loop system of FIG. 1. Therefore, the design of a stabilizing MPC problem may require more than a single iteration.

The block diagram in FIG. 2 shows the key steps to obtain the PWAS approximated solution of the MPC problem through the method described by Bemporad et al. This method comprises a step S1 for solving a mpQP problem starting from the mathematical model shown in Formula 1, and a step S2 for solving a Quadratic Programming (QP) optimization problem (minimization of the cost function in Formula 6 subject to the constraints in Formula 7), in order to get, respectively, the optimal solution $u^*_0(x)$ and the approximated solution u(x). After that, if the approximated solution u(x) is able to stabilize the closed-loop system, the solution is accepted, and is used for generating the digital circuits of the MPC controller. Otherwise, steps S1/S2 may be repeated by varying the parameters (e.g. number of subintervals $p_j$, type of basis functions, etc.) and/or the MPC constraints (on input u, output y, and state x), in order to find a different approximated solution u(x) that is stabilizing.

The execution of the above-described method requires a relevant amount of resources, since it is necessary to compute both the optimal solution $u^*_0(x)$ and the approximated solution u(x). This makes particularly difficult to find an approximated solution u(x) able to stabilize the model of the physical process, because it is necessary to change the parameters and the MPC constraints of two distinct programming problems.

Moreover, solving the mpQP problem may hit the memory and CPU requirements of a design platform, because of the combinatorial explosion of the number of regions.

The present invention aims to solve these and other problems by providing a method for creating digital circuits implementing a feedback control system based on an approximated solution of an MPC problem, without solving any mpQP problem at all. In addition to that, the present invention aims to solve these and other problems by providing circuit architectures for the implementation of the control system.

The main idea of the present invention is the generation of an approximated solution u(x) by solving only a single programming problem. Further advantageous features of the present invention are the subject of the attached claims. The features of the invention are specifically set forth in the claims annexed to this description; such characteristics will be clearer from the following description of a preferred and non-exclusive embodiment shown in annexed drawings, wherein:

Figure 1:
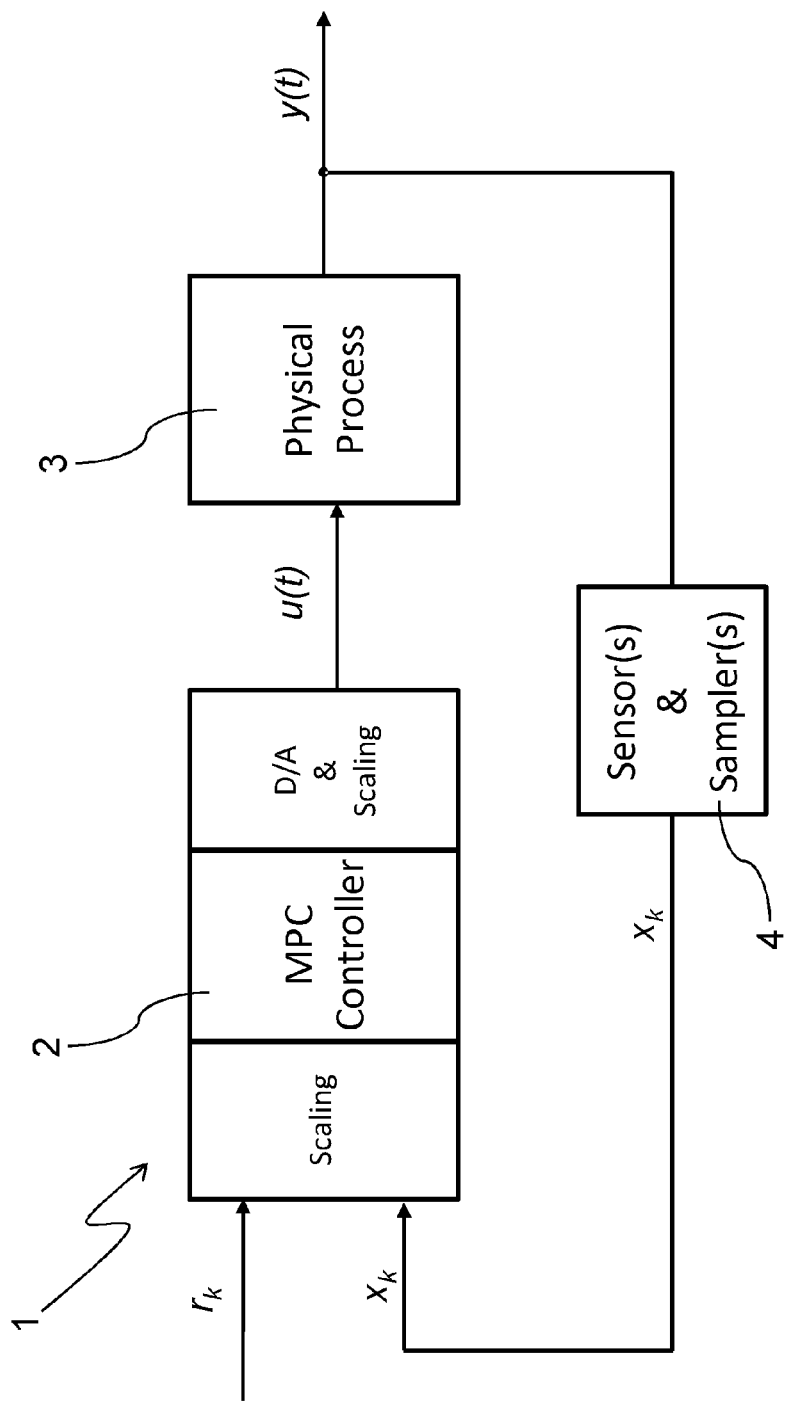
FIG. 1 shows a block diagram of a closed-loop system controlled by a feedback control system that implements a Model Predictive Control (MPC) technique.
Figure 2:
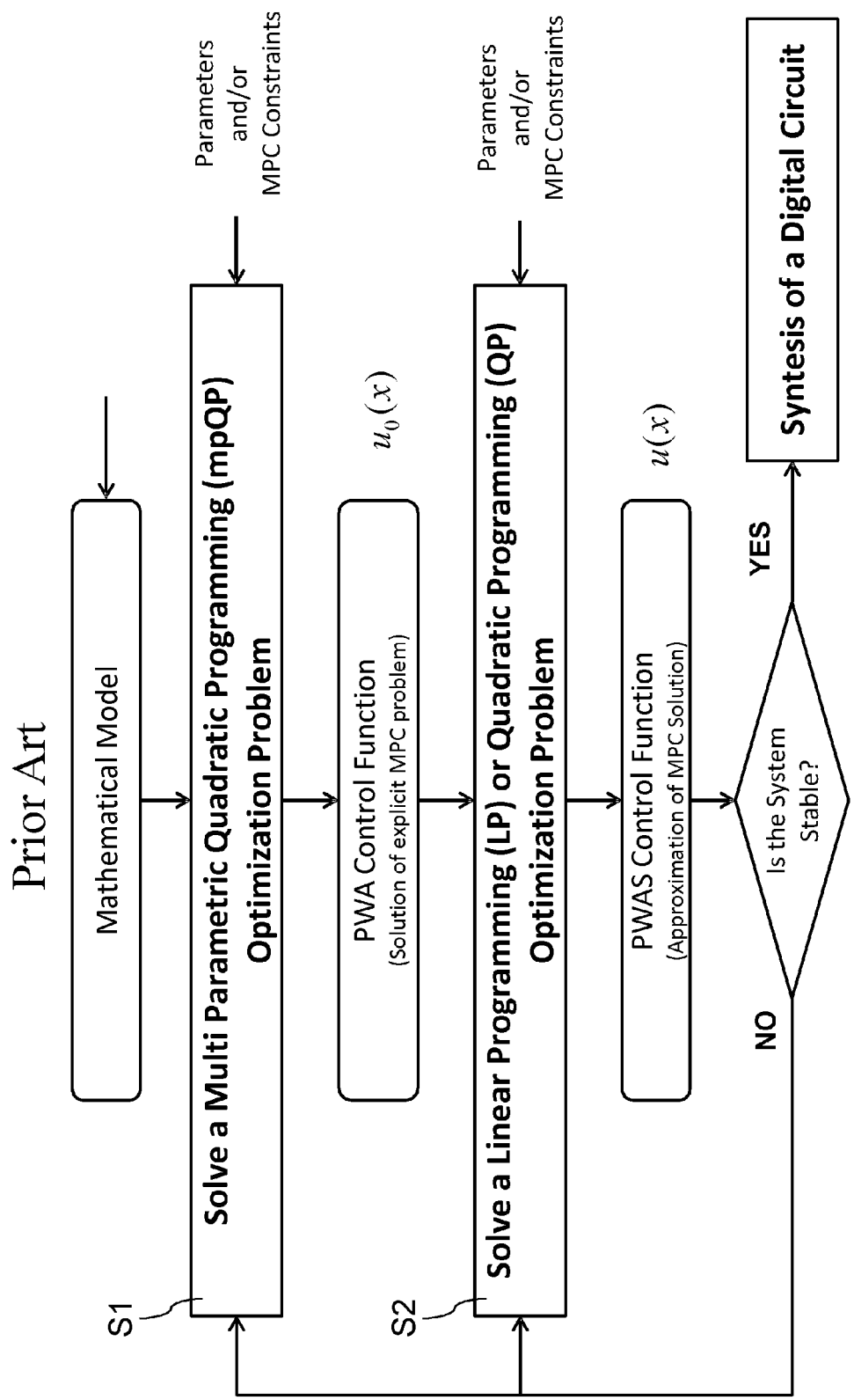
FIG. 2 shows a flow diagram representing the method described in the prior art document authored by Bemporad et al., titled "Ultra-Fast Stabilizing Model Predictive Control via Canonical Piecewise Affine Approximations," and published on IEEE Transaction on Automatic Control, pp. 2883-2897, Dec. 2011 (doi: 10.1109/TAC.2011.2141410)
Figure 4:
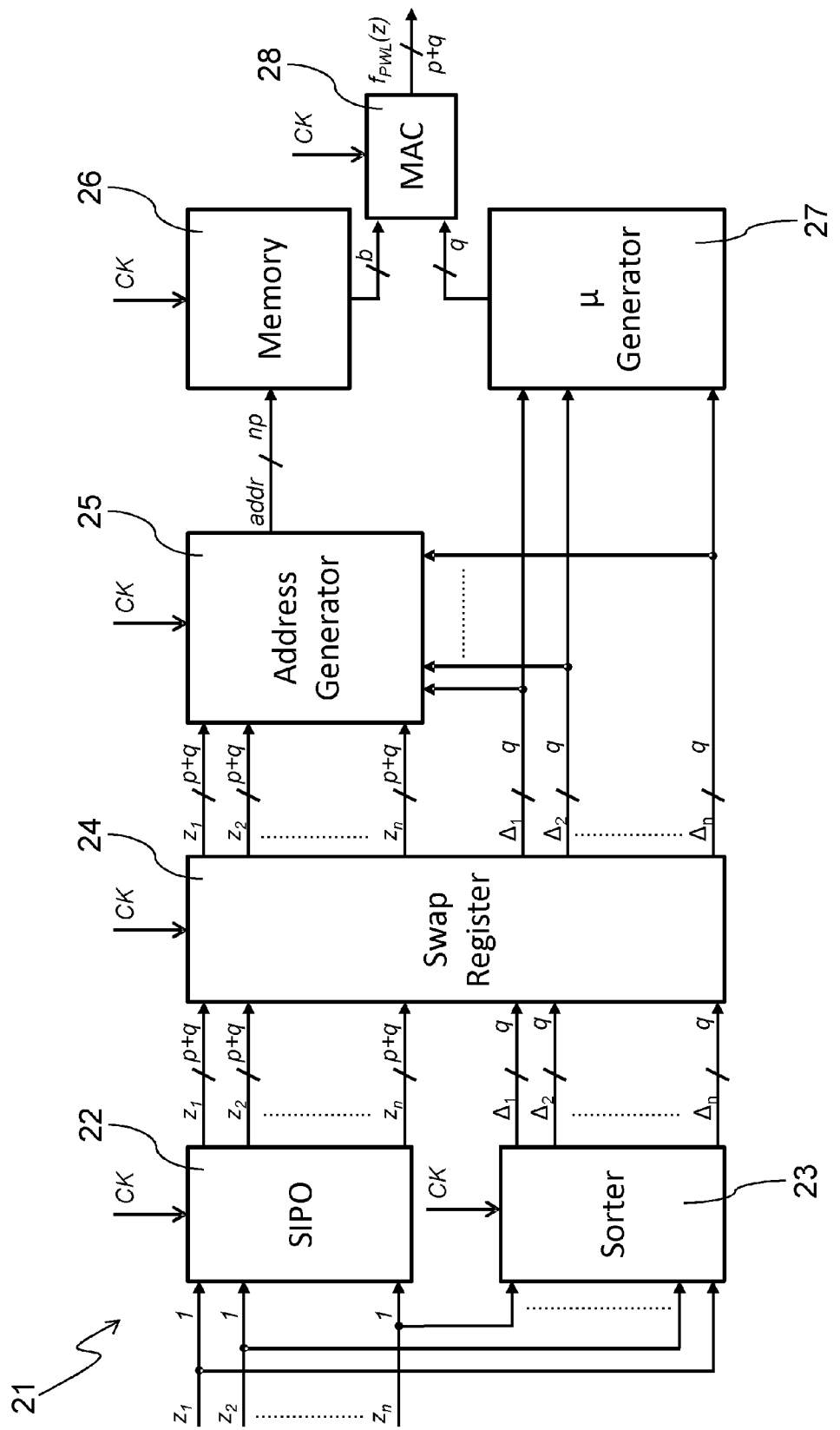
Figure 5:
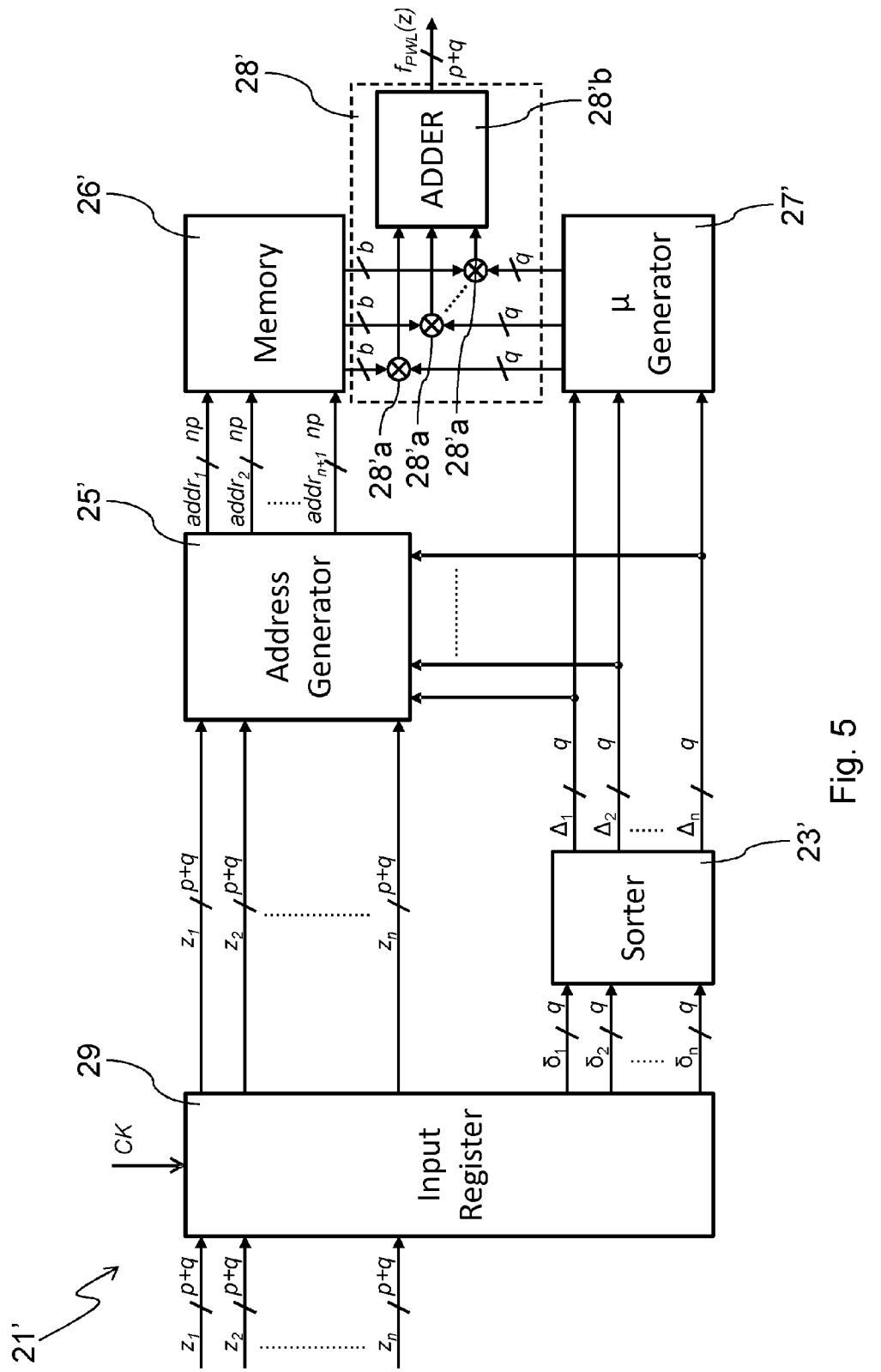
Figure 6:
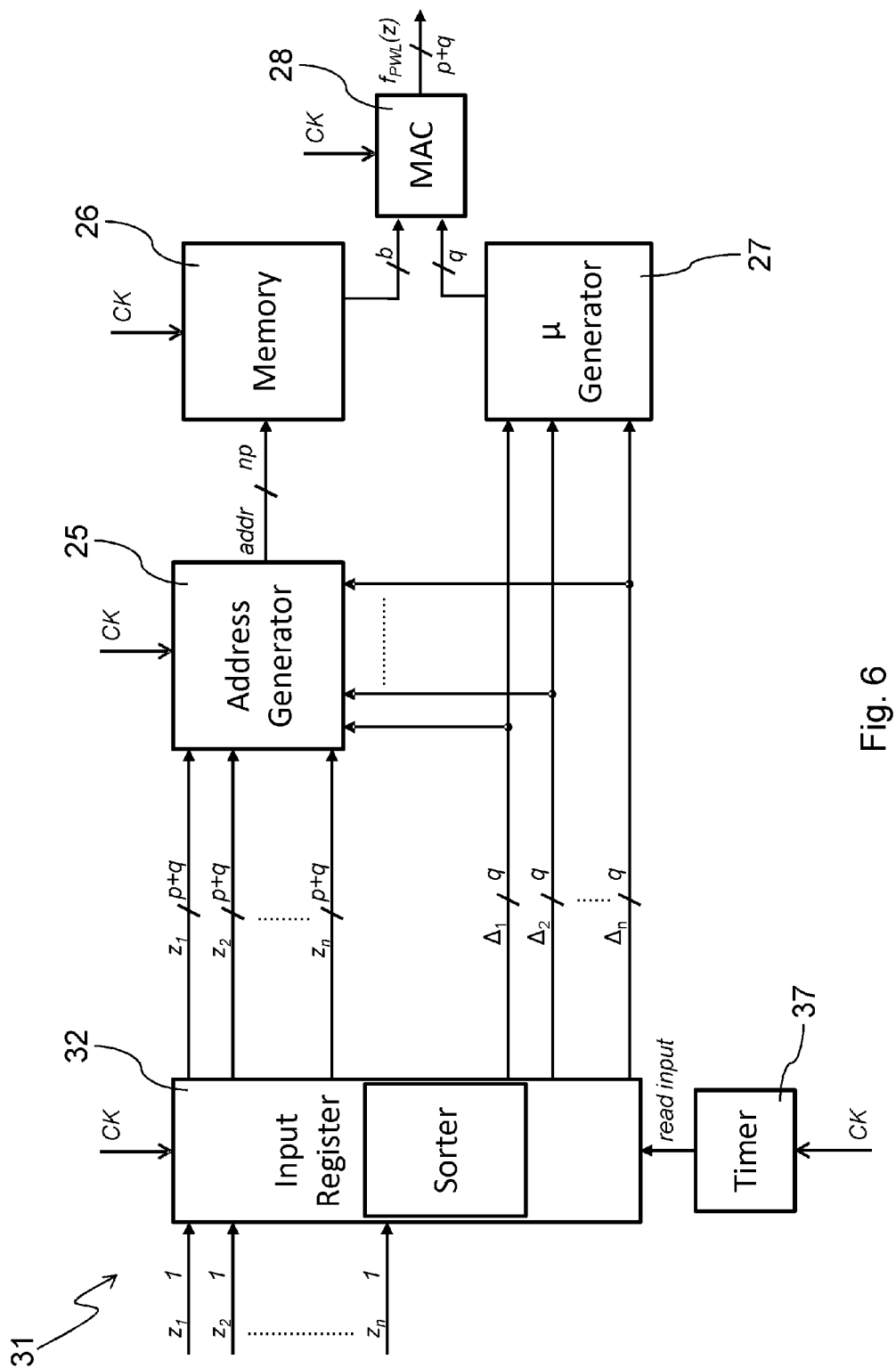
Figure 7:
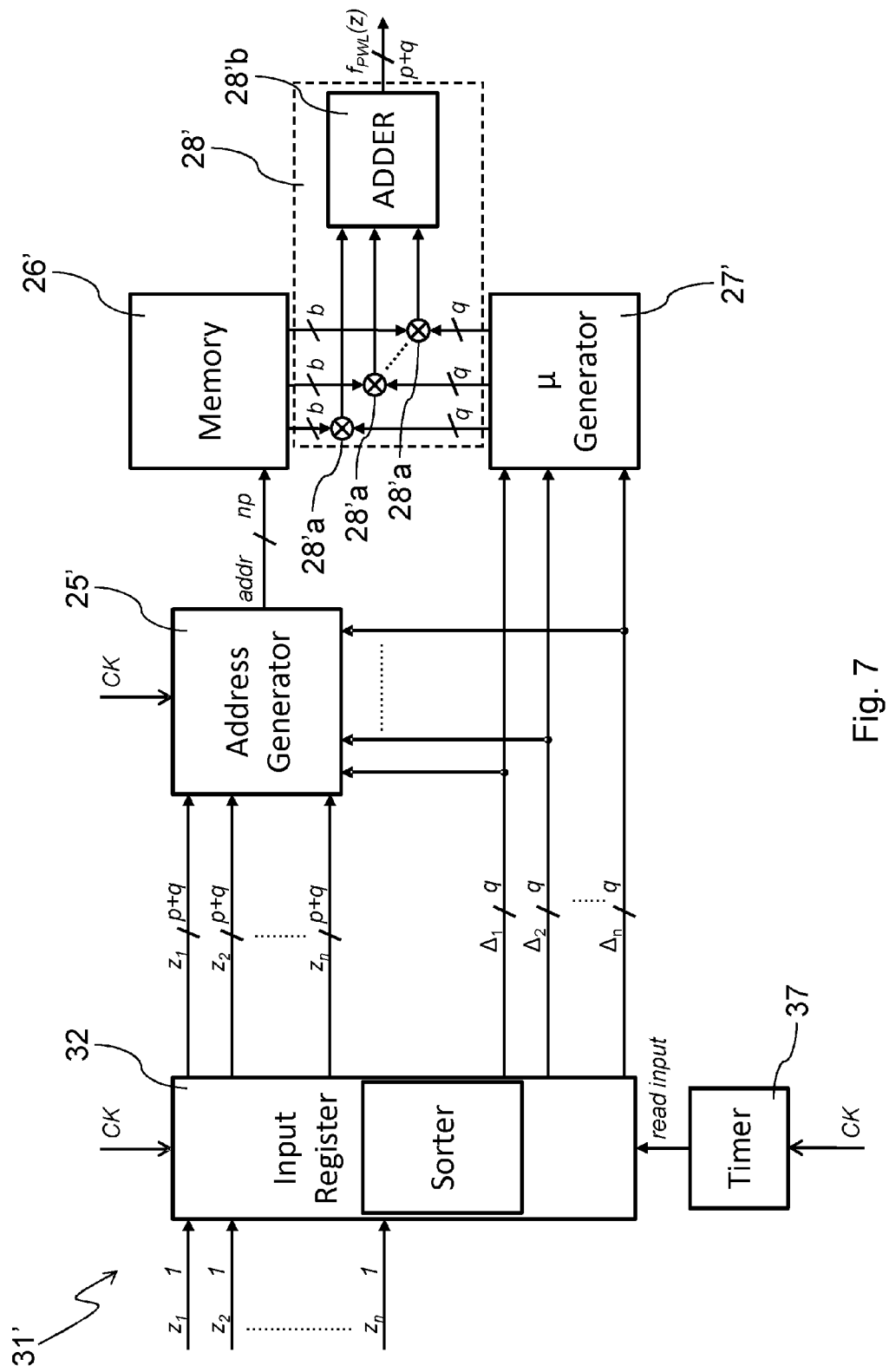
Figure 9:
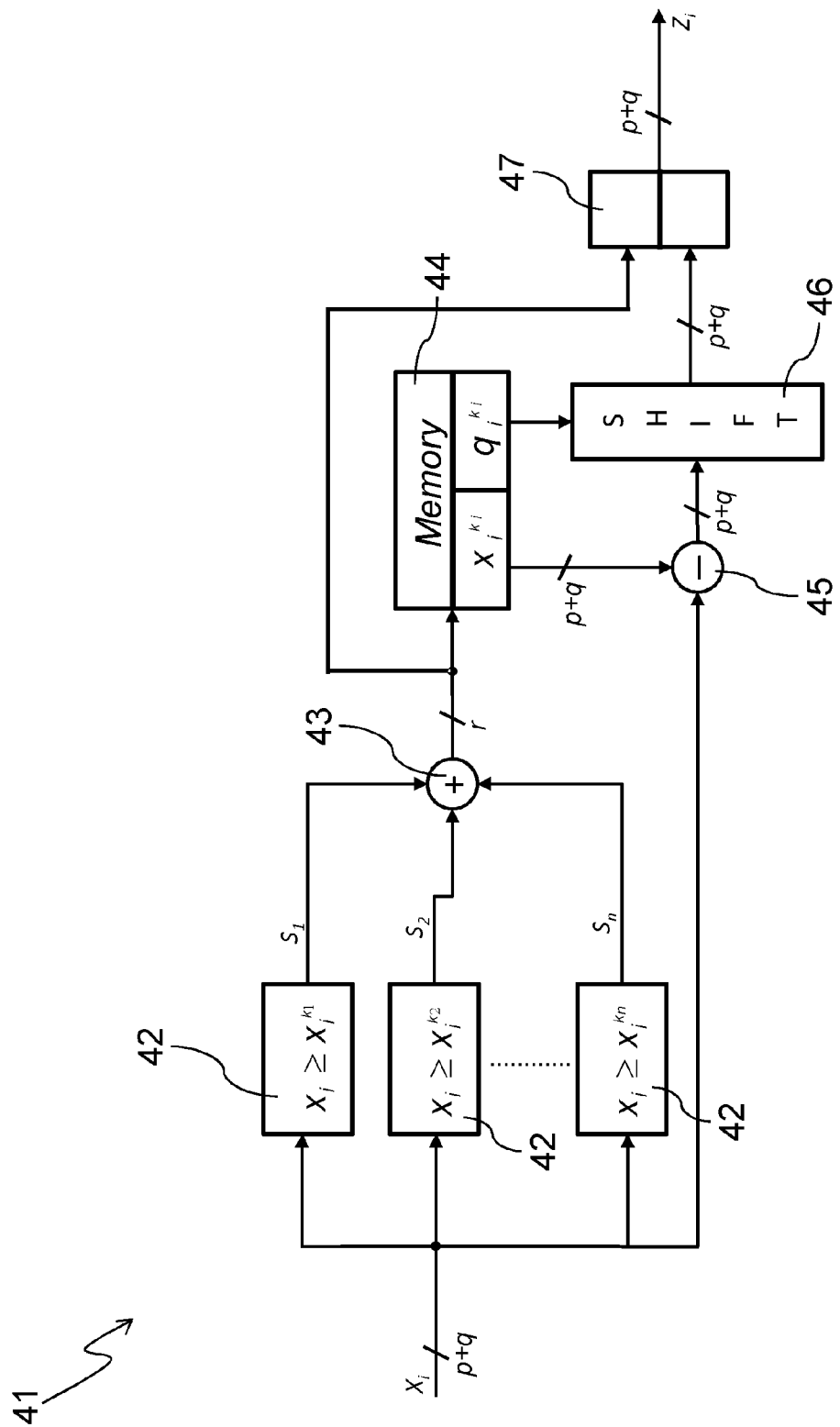
Figure 10:
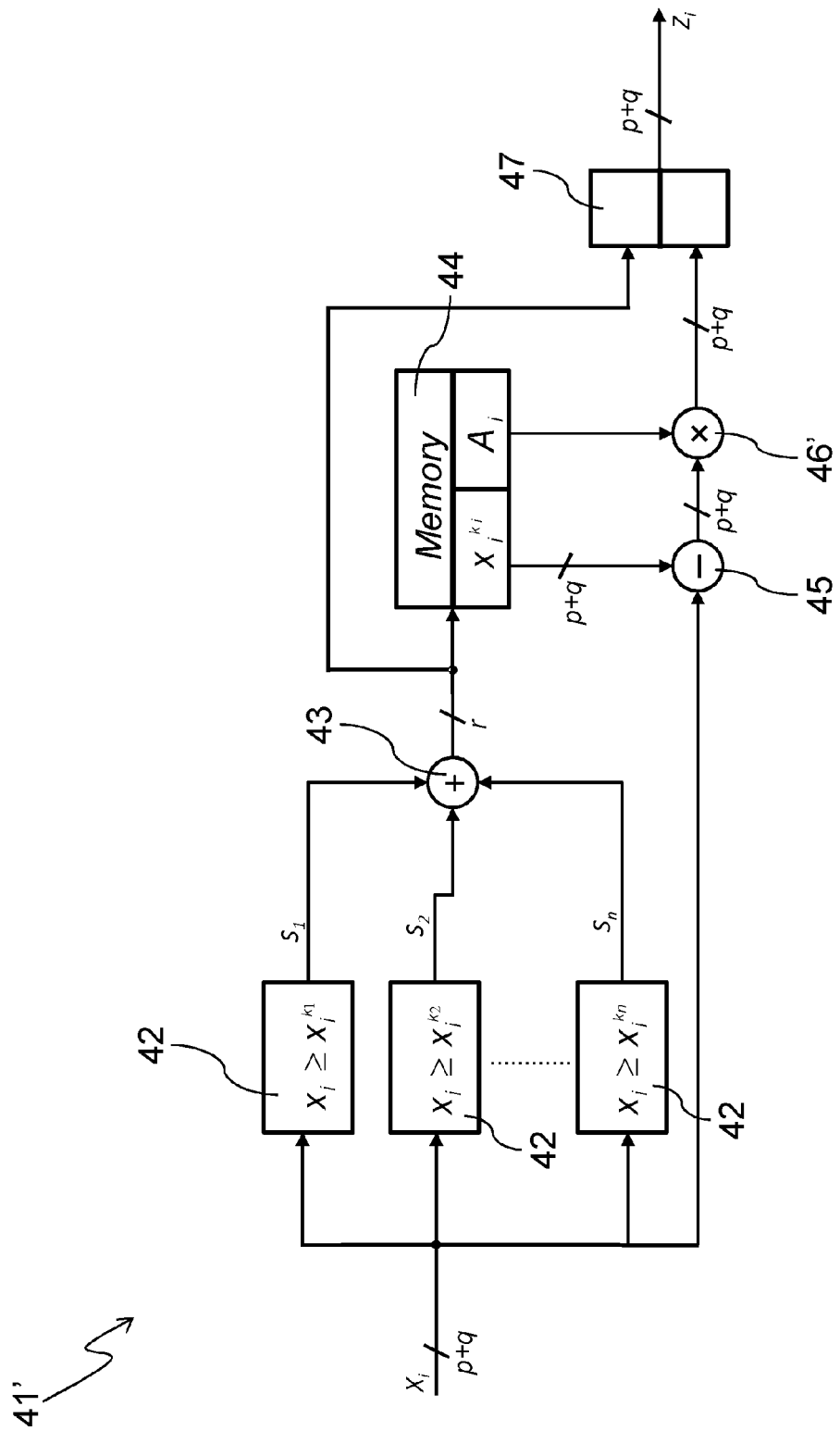

FIG. 4 shows a block scheme representing a generic (serial) circuit architecture implementing a PWAS function and described in the prior art document authored by M. Storace, T. Poggi, "Digital architectures for the circuit implementation of PWL multi-variate functions: two FPGA implementations," *International Journal of Circuit Theory and Applications*, vol. 39, pp. 1-15, 2011, doi: 10.1002/cta.610;

FIG. 5 shows a block scheme representing a (parallel) variant of the circuit architecture shown in FIG. 4, described in the prior art document authored by M. Storace, T. Poggi, "Digital architectures for the circuit implementation of PWL multi-variate functions: two FPGA implementations," *International Journal of Circuit Theory and Applications*, vol. 39, pp. 1-15, 2011, doi: 10.1002/cta.610;

FIG. 6 shows a block scheme representing a modified generic serial circuit architecture based on the one shown in FIG. 4, more suitable for the implementation of the MPC controller shown in FIG. 1;

FIG. 7 shows a block scheme representing a modified generic parallel circuit architecture based on the one shown in FIG. 5, more suitable for the implementation of the MPC controller shown in FIG. 1;

FIGS. 8a-c show three alternative input acquisition blocks for the generic circuit architectures displayed in FIGS. 6 and 7;

FIG. 9 shows a circuit block to be used in the circuit architectures displayed in FIGS. 4,5,6,7, which allows to handle non-uniform simplicial partitions, according to the prior art document authored by T. Poggi, F. Comaschi, M. Storace, "Digital circuit realization of piecewise affine functions with non-uniform resolution: theory and FPGA implementation," *IEEE Transactions on Circuits and Systems-II: Transaction Briefs*, vol. 57, n. 2, pp. 131-135, Feb. 2010, doi: 10.1109/TCSII.2010.2040316;

FIG. 10 shows an improved version of the circuit block displayed in FIG. 9.

In FIG. 1, a closed-loop system 1 is shown. This system 1 comprises an MPC controller 2 implementing an MPC technique (and including input and output signal conditioning blocks and an output digital-to-analog converter), a physical process 3 producing an output y(t) coincident with the system state x(t) (i.e., with C=I), and a set of sensors and samplers 4 sampling the state x(t) with a sampling time $t_s$ and generating a sampled system state $x_k = x(t+kt_s)$.

The MPC controller takes a set of signals as input, wherein the set of signals comprises a sampled system state $x_k$ and a reference signal constant $r_k$. If $r_k=0$, the feedback block regulates the state of the physical process to the origin and $r_k$ can be omitted from the formulation. Otherwise, in Formula 2 one must extend the prediction model (A,B) by augmenting the state vector to $X_k=[x_k,r_k,u_{k-1}]$ and treat $\Delta u_k=u_k-u_{k-1}$ as the new input signal. In this way, the tracking performance to be minimized can be expressed by penalizing $e_k=x_k-r_k=[I\ -I\ 0]X_k$, and by setting $Q=[I\ -I\ 0]'Q_y[I\ -I\ 0]$, where $Q_y$ is a weight matrix on $e_k$, terminal weight P=0, and assigning to matrix R the role of weighting input increments. The role of the MPC controller 2 is to generate a control output comprising a control signal u(t), which is constant during each time interval $[kt_s,(k+1)t_s)$, and is applied to the physical process 3 as input. In order to control the physical process 3 by maintaining the error signal within an error interval, the MPC controller executes a control method for controlling the physical process 3 comprising the following steps:

a. read the state $x_k=x(t+kt_s)$
b. compute the control value $u_k$ by using a control law u(x);
c. apply the control signal $u_k=u(t+kt_s)=u(x_k)$ to the physical process 3;
d. at time $t+(k+1)t_s$ return to step (a).

In this way, the system 1 can show a stable behavior.

Figure 3:
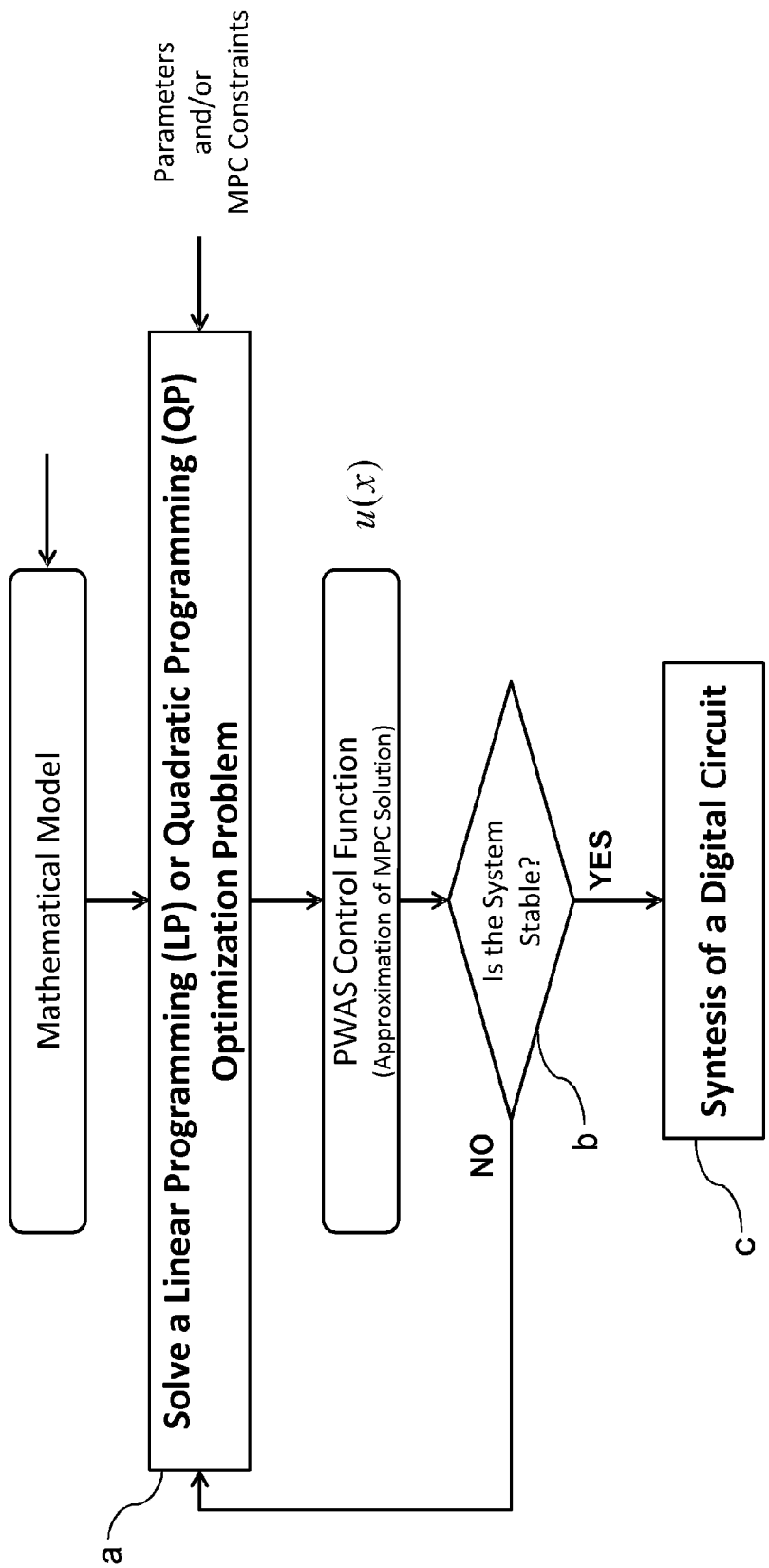
FIG. 3 shows a flow diagram representing a method for creating digital circuits of a feedback control system according to the invention.

As shown in FIG. 3, the control law u(x) is computed by solving a single Quadratic Programming (QP) or Linear Programming (LP) problem without computing the optimal solution $U^*_{PWA}(x)$ (also called multiparametric quadratic programming solution). In order to avoid the intermediate computation of the optimal solution $U^*_{PWA}(x)$, the cost function shown in Formula 6 has been sampled at vertices $v_i$, where i ranges from 1 to $N_v$. In this way, solving a mpQP problem is no longer required, only a QP problem must be solved, as described below. As for the prior art document, also a LP formulation can be obtained, but it will not be explicitly presented here (we focus on the QP formulation). A PWAS function U(x)∈PWAS, $U: \Re^n \to \Re^{N_u+1}$, can be expressed in the following way $$U(x) = \begin{bmatrix} u_0(x) \\ \vdots \\ u_{N_u}(x) \\ \sigma(x) \end{bmatrix}$$

$$= \begin{bmatrix} (w^0)'\varphi(x) \\ \vdots \\ (w^{N_u})'\varphi(x) \\ (w^\sigma)'\varphi(x) \end{bmatrix}$$

$$= \begin{bmatrix} \varphi(x) & 0 & \cdots & 0 \\ 0 & \varphi(x) & \cdots & 0 \\ \vdots & \vdots & \ddots & \vdots \\ 0 & 0 & \cdots & \varphi(x) \end{bmatrix} w$$

$$= \Phi(x)w$$

Formula 8 where φ(x) is a properly chosen PWAS basis and w= $[(w^0)',\ldots,(w^{N_u})',(w^\sigma)']'$ is the vector of unknown parameters. Formula 8 extends Formula 5 to vector-valued PWAS functions.

In order to define uniquely an optimal control sequence $U^*(x) \in PWAS$, $U^*(x)=\phi(x)w^*$, and set a PWAS control law $u(x)=(w^{*,0})'\phi(x)$, the cost function is sampled at the vertices $v_i$, $i=1, \ldots, N_v$, of the simplicial partition and PWAS coefficients $w^*$ are calculated by solving the following QP problem $$w^* = \operatorname*{argmin}_{U} \left\{ \sum_{i=1}^{N_v} \left[ \frac{1}{2} U'(v_i) H U(v_i) + v'_i F U(v_i) + \frac{1}{2} v'_i Y v_i \right] \right\}$$ Formula 9 s.t. $GU(v_i) \leq W + Dv_i$, $i = 1, \ldots N_v$ $U(0) = 0$ where inequality constraints impose the feasibility of the solution (with respect to the original constraints of the MPC problem on inputs and outputs) and the equality constraint forces the control action vanish at the origin. The stability of the closed-loop system is not imposed by any constraint, thus it must be checked a posteriori. By eliminating the term $\frac{1}{2}v'_i Y v_i$, that does not affect the solution $w^*$, and by substituting Formula 8 into 9, one obtains $$w^* = \operatorname*{argmin}_{w} \left\{ \sum_{i=1}^{N_v} \left[ \frac{1}{2} w'\Phi'(v_i) H \Phi(v_i) w + v'_i F' \Phi(v_i) w \right] \right\}$$ Formula 10 s.t. $G\Phi(v_i)w \leq W + Dv_i$, $i = 1, \ldots N_v$ $\Phi(0)w = 0$

Finally, by setting $\overline{H}_i = \phi'(v_i) H \phi(v_i)$, $\overline{F}_i = v'_i F'\phi(v_i)$ and $\overline{G}_i = G\phi(v_i)$, the coefficients $w^*$ can be found by solving the following QP $$w^* = \operatorname*{argmin}_{w} \left\{ \frac{1}{2} w' \left( \sum_{i=1}^{N_v} \overline{H}_i \right) w + \left( \sum_{i=1}^{N_v} \overline{F}_i \right) w \right\}$$ Formula 11 s.t. $\overline{G}_i w \leq W + Dv_i$, $i = 1, \ldots N_v$ $\Phi(0)w = 0$

The above-stated problem can be advantageously solved without computing the optimal solution $U^*_{PWA}(x)$ of the MPC problem. Therefore, it is possible to save off-line computational resources by using this advantageous problem formulation. In this way, reaching a solution for this problem may require less design time than before.

Concerning feasibility, notice that the original constraints in Formula 3 are imposed only at the vertices of the simplicial partition in Formula 11. This guarantees feasibility at all states x, as for each simplex S of the partition the condition $GU(v_i) \leq W + Dv_i$ imposed at all the vertices $v_i$ of S and the linearity of $U(x)$ on S implies that $GU(x) \leq W + Dx$, $\forall x \in S$. To ensure closed-loop stability under the control law $u(x) = (w^{*,0})'\phi(x)$, an a posteriori stability check of the solution must be carried out, for example by constructing a PWA Lyapunov function as in the aforementioned method of Bemporad et al.. The construction of a Lyapunov function can be done by following well-known methods, which do not fall within the scope of this application.

If the stability check is positive, the solution $u(x)$ is kept, otherwise a new solution is computed by varying the parameters and/or the MPC constraints.

When a stabilizing approximate PWAS control law $u(x)$ is found, it is possible to create one or more digital circuits that implement it, i.e. that implement an approximate MPC. Summarizing, the method for creating digital circuits according to the invention comprises the following steps:
 a. define a simplicial partition for the set of states;
 b. compute the control law $u(x)=(w^{*,0})'\phi(x)$ by solving the QP problem in Formula 11, based on a model of the physical process 3, a linear or quadratic performance index, and linear constraints on input, state, and output variables;
 c. check the stability of the closed-loop system under the control law $u(x)$;
 d. synthesize a digital circuit that implements $u(x)$, based on the values $u(v_i)$ at the vertices $v_i$.

To synthesize the digital circuits of a feedback control system, generic circuit architectures are used. These architectures can be easily implemented on FPGA, DSP, or the like by simply using the basis function $\phi(x)$ and the parameters $w^{*,0}$ as input data for the synthesis process.

In the following, we describe two prior art circuit architectures, proposed in the paper M. Storace, T. Poggi, "Digital architectures for the circuit implementation of PWL multivariate functions: two FPGA implementations," *International Journal of Circuit Theory and Applications*, vol. 39, pp. 1-15, 2011, doi: 10.1002/cta.610.

In FIG. 4, a generic serial circuit architecture 21 is shown. The generic serial circuit architecture 21 computes the value of a PWAS (scalar) function $f_{PWL}(z)$ by taking coordinates of a point z as input, where $f_{PWL}$ and z are scaled versions (not shown in the attached figures) of the control law u and of the state x, respectively.

In order to compute the value of the PWAS function $f_{PWL}(z)$ in a very efficient way, this architecture circuit 21 exploits the regularity of the partitions. The domain of the PWAS function $f_{PWL}(z)$ must be resealed so that each dimension is partitioned into segments with unitary length, i.e. the coordinates of the vertices of the simplicial partition have integer values. In this way, the PWAS function $f_{PWL}(z)$ can be evaluated in three steps:
 a. locate the hypercube containing the point z by using the integer part of the coordinates of the point z;
 b. locate which of the n! simplices contained in the selected hypercube contains the point z by using the decimal part of the coordinates of the point z;
 c. compute the value of $f_{PWL}(z)$ by linear interpolation of the value of $f_{PWL}$ at the vertices of the selected simplex.

If one needs to compute a vector PWAS function, the circuit can be replicated as many times as the number of components of the function.

The generic serial circuit architecture 21 comprises a Serial Input-Parallel Output (SIPO) register 22, a sorter 23, a swap register 24, an address generator 25, a memory 26, a μ-generator generator 27, and a Multiply Accumulate Unit (MAC) 28.

Both the SIPO register 22 and the sorter 23 take the data z as input; the data z is coded with p bits representing the integer part of the coordinate and q bits representing the decimal part.

The SIPO register 22 converts the serial input to parallel output, and loads it in the swap register 24. The sorter 23 implements a rank-extractor algorithm as described by Pedroni, in the paper titled "Compact Hamming-comparator-based rank order filter for digital VLSI and FPGA implementations" published in Proceedings of the 2004 IEEE International Symposium on Circuits and Systems (ISCAS 2004) on pages 585-588, doi: 10.1109/ISCAS.2004.1329339. This algorithm is used in the sorter 23 to sort the n strings of q least significant bits of the input data i=1, ..., n. In this way, sorter 23 produces sorted strings $\hat{\delta}_i$ (i=1, ..., n)($\hat{\delta}_1 > \hat{\delta}_2 > ... > \hat{\delta}_n$) as outputs, which are provided in parallel fashion, through the swap register 24, to the μ-generator 27 and the address generator 25. The μ-generator 27 is a combinatorial network that, starting from the sorted strings $\hat{\delta}_i$, computes n+1 terms $\mu_j$ for the current input and provides them to the MAC 28. The $\mu_j$ coefficients, represented with q-bit precision, are calculated as shown in Formula 12.

$$\mu_0 = 1 - \hat{\delta}_1$$

$$\mu_1 = \hat{\delta}_1 - \hat{\delta}_2 \ldots$$

$$\mu_{n-1} = \hat{\delta}_{n-1} - \hat{\delta}_n$$

$$\mu_n = \hat{\delta}_n \quad \text{Formula 12}$$

The address generator 25 is a combinatorial network that, starting from the integer and decimal parts of the point z and from the sorted strings $\hat{\delta}_i$, generates the address of one of the n+1 coefficients $w_j$ representing the values of the PWAS function $f_{PWL}(z)$ in the vertices of the simplex containing z. These addresses are provided to the memory 26 that contains all values of the PWAS function in the vertices of the simplicial partition.

The memory 26, properly addressed, provides the n+1 coefficients $w_j$ to the MAC 28. Each coefficient $w_j$ is coded with a number b of bits.

The MAC 28 computes the value of the PWAS function $f_{PWL}(z)$ by evaluating Formula 13.

$$f_{PWL}(z) = \sum_{j=0}^{n} \mu_j w_j \quad \text{Formula 13}$$

After the computation of the value of the PWAS function $f_{PWL}(z)$, the q less significant bits of $f_{PWL}(z)$ are discarded, in order to scale the coefficients $\mu_j$ from the interval $[0, 2^q - 1]$ to $[0,1]$.

The SIPO register 22 and the sorter 23 require s clock periods for loading their output in the swap register 24, and the address generator 25 requires t clock cycles for performing its combinatorial operation. Finally, the u-generator 27 requires r clock cycles for doing its computations. It is possible to notice that t and r depend only on the working frequency of the circuit. Therefore, the total number of clock cycles required to process a single input is p+q+s+max{t,r}+(n+3), that is linear with respect to the number of inputs and to the number of bits used to code the input.

Due to the presence of the swap register 24, the processing can be pipelined, thus allowing an input sampling period of s+max {p+q+max {t,r}, (n+3)} clock cycles.

A first variant of the above-described generic circuit architecture 21 is shown in FIG. 5. For brevity's sake, the following description highlights only the parts that differ from the main embodiment, for the same reason, the identical numerical references with one or more quotes are used to indicate functionally equivalent elements.

A generic parallel circuit architecture 21', which is functionally equivalent to the generic serial circuit architecture 21, comprises an input register 29. This register is used to synchronize the input (the point z) with the other components. Indeed, the generic parallel circuit architecture 21' also comprises a sorter 23', an address generator 25', a memory 26', a μ-generator 27', and multipliers-adder 28' replacing the MAC 28. The multipliers-adder 28' comprises n+1 multipliers 28'a and an adder 28'b.

Since the generic parallel circuit architecture 21' is able to perform parallel data processing, the coefficients $w_j$ and $\mu_j$ have to be provided to the multipliers 28'a at the same time. For this reason, the address generator 25' produces in parallel n+1 different addresses, the μ-generator generator 27' n+1 different coefficients $\mu_j$, and the memory 26' provides n+1 different coefficients $w_j$.

The present invention aims to improve and generalise these circuit architectures. In addition to that, the present invention aims to modify these circuit architectures to make them usable for control applications. Control systems, indeed, must execute the following steps:

a. read system state $x_k$ at time $t + kt_s$;
 b. scale $x_k$ to $z_k$;
 c. compute the control action $f_{PWL}(z_k)$;
 d. scale $f_{PWL}(z_k)$ to $u_k$ and send it in output at time $t + kt_s + \delta$, being $\delta \ll i_s$ the circuit latency;
 e. wait until time $t + (k+1)t_s$ before reading next state $x_{k+1}$.

To accomplish to this temporal sequence of steps a number of changes have been applied to the prior art circuit architectures. These changes are described below.

A serial circuit architecture 31, which is shown in FIG. 6, has been created by us in order to improve the circuit architecture 21. In the serial circuit architecture 31, the swap register 24 of the architecture 21 has been removed, thus eliminating the pipeline. With the pipeline, indeed, the state $x_{k+1}$ would have been read before applying the control move for state $x_k$. In addition to that, the serial circuit architecture 31 comprises a timer 37 in order to allow that the states are sampled with the correct sampling time $t_s$. In the circuit architecture 21, the circuit samples the state as soon as it finishes the previous computation, without respecting the specifications (sampling time) imposed in the controller design.

The serial circuit architecture 31 is more flexible than circuit 21, since it comprises an input register 32, which can be configured, as shown in FIGS. 8a-8c, to read the state in three different ways: (i) serial bit-wise, i.e. one bit of all state components is read at each rising edge of the system clock, (ii) serial component-wise, i.e. a whole component is read at each rising edge of the clock or (iii) in parallel, i.e. all components are read together. This allows to interface the circuit with different A/D converters without any effort.

A further upgrade of the multiple-input single output (MISO) serial circuit architecture 31 consists in the possibility of computing multiple outputs, thus obtaining a MIMO circuit architecture. In this case different PWAS functions $f_{PWL}(z)$ are associated to the same simplicial partition, so the computation of all PWAS functions $f_{PWL}(z)$ can be fastened by solving just once the point location problem, since all PWAS functions $f_{PWL}(z)$ are partitioned in the same way. In practice the computation of PWAS vector functions is made possible by inserting several memory banks in the block memory 26,26', one bank for each PWAS function $f_{PWL}(z)$, with the value of the different functions in the vertices of the simplicial partition. In the serial architecture 31 the various functions are computed in sequence, while in the parallel architecture 31' (shown in FIG. 7) they are computed at the same instant. Without this improvement (i.e., in the circuit architectures 21 and 21'), the computation of vector functions has to be performed by replicating the same architectures several times, without taking advantage of the fact that the simplicial partition is common to all functions.

FIG. 7 shows a parallel circuit architecture 31', which is a variant of the upon-mentioned serial circuit architecture 31. The approach adopted to design the parallel circuit architecture 31' has similarities with the one used for the parallel circuit architecture 21'. The parallel circuit architecture 31' is functionally equivalent to the serial circuit architecture 31.

Since the parallel circuit architecture 31' is able to perform parallel data processing, the coefficients $w_j$ and have to be provided to the multipliers 28'$a$ at the same time. For this reason, the address generator 25' produces in parallel n+1 different addresses, the μ-generator 27' n+1 different coefficients $\mu_j$, and the memory 26' provides n+1 different coefficients $w_j$.

A further improvement is concerned with non uniform simplicial partitions. In [T. Poggi, F. Comaschi, M. Storace, "Digital circuit realization of piecewise affine functions with non-uniform resolution: theory and FPGA implementation," *IEEE Transactions on Circuits and Systems-II: Transaction Briefs*, vol. 57, n. 2, pp. 131-135, Feb. 2010, doi: 10.1109/TCSII.2010.2040316] only non-uniform partitions are handled, where the distance between near vertices is a power of two. This limits the range of applications in which the architecture can be used. The cited reference discloses a circuit block 41 shown in FIG. 9; this circuit block 41 is able to convert the state $x_i$ into the input data $z_i$ for circuits 21, 21', 31 and 31'.

The circuit block 41 comprises n comparators 42, an adder 43, a memory 44, a subtractor 45, a shift register 46, and an output register 47.

The circuit block 41 receives the i-th component $x_i$ of the state x as input, and the comparators 42 compare the i-th component $x_i$ of the state x with the i-th component of all vertices ($x_i^{k_j}$,j=1, . . . , n) of the non-uniform simplicial partition. Each comparison gives as result one bit ($s_k$, k=1, . . . , n) and all these bits are summed up by the adder 43 to obtain an address value having r bits, which is taken by the memory 44 as input. In this way, the memory 44 produces an output comprising a shifting value $q_i^{k_j}$ and the i-th component of the vertex $x_i^{k_j}$ identifying the hyper-rectangle containing the state x. The said vertex $x_i^{k_j}$ is the one, between the $2^n$ vertices characterizing a hyper-rectangle, with smaller coordinates.

The i-th component of the vertex $x_i^{k_j}$i is then subtracted with subtractor 45 from the i-th component $x_i$ of the state x. In order to perform the scaling, the output of the subtractor 45 is then shifted by the shifter 46 of a number of positions equal to the shifting value $q_i^{k_j}$.

Finally, the address value and the output of the shifter 46 are concatenated with block 47 to obtain the scaled state $z_i$, which is produced by the circuit block 41 as output.

The scaling of the input state x is performed component-wise, indeed block 41 is replicated n times in the circuit.

In FIG. 10, a circuit block 41', which is functionally equivalent to the circuit block 41, is shown. This circuit block 41', which has been created by us, is able to handle any kind of non-uniform partition of the PWAS function $f_{PWL}(z)$. To do this, the circuit block 41' comprises a multiplier 46' replacing the shift register 46, wherein said multiplier 46' performs transformation from non-uniform to uniform domain.

Summarizing, the circuit block 41' converts the state ($x_i$) of the physical process (3) into the input data ($z_i$) for the circuit architectures (31,31') by implementing a mapping function, wherein the domain of the state ($x_i$) is non-uniformly partitioned, and the domain of the PWAS function $f_{PWL}(z)$ is uniformly partitioned.

It is understood that variants of the method for creating digital circuits of a feedback control system that implements an approximation technique for an MPC controller and/or of the circuit architectures of the said control system still fall within the scope of the following claims.

The invention claimed is:

1. Method for creating digital circuits comprised in an MPC controller, which implements an approximation technique for Model Predictive Control (MPC), in which a quadratic programming or linear programming optimization problem is formulated based on a linear state-space dynamical model of a physical process having a state x, and provides a control law (u(x)) defined over a partition that contains simplices having vertices ($v_i$,), where i ranges from 1 to $N_v$, and wherein the vertices ($v_i$) are comprised in a given set of states of the physical process, wherein said method comprises the following steps:
   a. compute a solution (w*) of the optimization problem and define the control law (u(x));
   b. check the stability of a closed-loop system under the control law u(x), wherein the closed-loop system comprises the MPC controller and the physical process; and
   c. synthesize a digital circuit by starting from the control law (u(x)) and the vertices ($v_i$).

2. Method according to claim 1, wherein the step (a) is performed without computing a multiparametric quadratic programming solution ($U^*_{PWA}$ (x)) of an MPC problem.

3. Method according to claim 2, wherein the control law (u(x)) is defined as the product between a vector of basis functions ($\phi(x)$) and a vector of parameters constituting the solution (w*).

4. Method according to claim 1, wherein the model is defined by starting from a physical process.

5. Method according to claim 1, wherein every dimensional component ($x_j$) of the state (x), where j =1, . . . , n, is divided into $p_j$ subintervals of uniform length, so that the set of states is divided into hyper-rectangles, and contains the $N_v$ vertices ($v_i$), where $N_v = \Pi_{j=1}^{n}(p_j +1)$.

6. Method according to claim 5, wherein each hyper-rectangle is partitioned into n! simplices with non-overlapping interiors.

7. Method according to claim 1, wherein the step (b) comprises a sub-step in which, starting from the control law (u(x)), the construction of a Lyapunov function is attempted.

8. Method according to claim 1, wherein the digital circuits synthesized at step (c) are implemented on FPGA, DSP, or the like.

9. Circuit architecture for computing a value of at least one piecewise-affine simplicial (PWAS) function ($f_{PW}L(z)$), comprising an address generator, a memory, and a μ-generator, wherein said address generator takes coordinates of a point (z) as input, and the point (z) having n dimensions is obtained by rescaling a state (x) of a model, and wherein the circuit is able to perform the following steps:
   a. locate an hypercube containing the point (z) by using integer parts of the coordinates of the point (z) as input of the address generator;
   b. locate which of n! simplices contained in the selected hypercube contains the point (z) by using decimal parts of the coordinates of the point (z) as input of the μ-generator and of the address generator; and
   c. compute the value of the PWAS function ($f_{PW}L(z)$) in point (z) by linear interpolation of the value of said function ($f_{PW}L(z)$) in the vertices of the selected simplex; wherein, both the address generator and the memory are synthesized starting from a control law (u(x)) and vertices ($v_i$), which are computed by a method according to claim 1.

10. Circuit architecture according to claim 9, wherein the value of the PWAS function ($f_{PW}L(z)$) is the sum of the products between coefficients $w_j$, which are stored in the memory, and coefficients $\mu_j$, which are generated by the μ-generator,
    wherein both sets of coefficients depend on the point (z), where j ranges from 1 to n.

11. Circuit architecture according to claim 10, wherein the memory comprises a number of memory banks equal to the number of PWAS functions ($f_{PW}L(z)$) to compute, wherein each memory bank contains the coefficients $w_j$ of each PWAS function ($f_{PW}L(z)$), and wherein all PWAS functions ($f_{PW}L(z)$) are partitioned in the same way, so that the steps (a) and (b) are common to all the PWAS functions ($f_{PW}L(z)$).

12. Circuit architecture according to claim 10, wherein the address generator generates an address of one of the coefficients $w_j$ contained in the memory, so that the memory provides the coefficient contained at said address as output, thereby providing a serial circuit architecture.

13. Circuit architecture according to claim 10, wherein the address generator generates addresses of all the coefficients $w_j$ contained in the memory, so that the memory provides all the coefficients $w_j$ as output, thereby providing a parallel circuit architecture.

14. MPC controller implementing an MPC technique for controlling a physical process, wherein said MPC controller takes inputs, and produces outputs, wherein the inputs comprise a sampled system state ($x_k$) and the outputs comprise a control signal ($u_k$), wherein the control signal ($u_k$) is generated through at least one PWAS function ($f_{PW}L(z)$), which is implemented by replicating one or more times a circuit architecture according to claim 9.

15. MPC controller according to claim 14, comprising a circuit block, which converts a state ($x_i$) of the physical process into an input data ($z_i$) for the circuit architectures by implementing a mapping function, wherein the domain of the state ($x_i$) is non-uniformly partitioned, and the domain of the PWAS function ($f_{PW}L(z)$) is uniformly partitioned.

\* \* \* \* \*